United States Patent [19]
Endo et al.

[11] 3,987,434
[45] Oct. 19, 1976

[54] ANGULAR DEVIATION SIGNAL GENERATOR

[75] Inventors: Yoshiaki Endo; Seizi Yamamoto; Takeshi Takayama, all of Amagasaki, Japan

[73] Assignee: Mitsubishi Denki Kabushiki Kaisha, Japan

[22] Filed: May 27, 1975

[21] Appl. No.: 580,736

Related U.S. Application Data
[63] Continuation of Ser. No. 409,361, Oct. 25, 1973.

[52] U.S. Cl. .......................................... 340/347 SY
[51] Int. Cl.[2] ....................................... H03K 13/02
[58] Field of Search ............................. 340/347 SY

[56] References Cited
UNITED STATES PATENTS

| | | | |
|---|---|---|---|
| 3,493,960 | 2/1970 | Doyle | 340/347 SY |
| 3,564,539 | 3/1969 | Dew | 340/347 SY |
| 3,618,073 | 11/1971 | Domchick et al. | 340/347 SY |
| 3,668,693 | 6/1972 | Eaton et al. | 340/347 SY |
| 3,675,234 | 7/1972 | Metz | 340/347 SY |
| 3,688,303 | 8/1972 | Metz | 340/347 SY |
| 3,713,141 | 1/1973 | Higgins et al. | 340/347 SY |
| 3,728,719 | 4/1973 | Fish | 340/347 SY |

*Primary Examiner*—Thomas J. Sloyan
*Attorney, Agent, or Firm*—Robert E. Burns; Emmanuel J. Lobato; Bruce L. Adams

[57] ABSTRACT

Analog signals, $+\sin\theta a$, $-\sin\theta a$, $+\cos\theta a$ and $-\cos\theta a$ where $\theta$ is a measured angle, are composed into a sine and a cosine signal phase shifted by $2\pi k/n$ where $k$ is one of $0, 1, 2, \ldots n$ as determined by values from the most significant digit to a $\pi/n$ bit digit of a binary command angle lying in one of $2n$ equal intervals into which a range of 0 to $2\pi$ is divided. The phase shifted cosine signal is attenuated as a linear function approximating a tangent of the true value of data expressed by all the remaining digits of the command angle or of its complement as determined by the $\pi/n$ bit digit. The attenuated cosine signal is added to the phase shifted sine signal for the true value of the data and subtracted from the latter for its complement providing an analog deviation between both angles.

4 Claims, 20 Drawing Figures

ANGULAR DEVIATION SIGNAL GENERATOR

This is a continuation of application Ser. No. 409,361, filed Oct. 25, 1973.

BACKGROUND OF THE INVENTION

This invention relates to a deviation signal generator circuit using analog signals representative of a sine and a cosine of an angle of rotation provided directly from a synchro-resolver or through a Scott transformer from a synchro device to obtain an analog signal representing a deviation of the angle of rotation from a digital command angle of rotation set externally.

Conventional deviation signal generator circuits of the type referred to have necessarily comprised a function transformation circuit for producing a sine and cosine output of an angle of rotation throughout a range of digital command angles of rotation, and a pair of variable attenuators operatively associated with the sine and cosine outputs respectively resulting in complicated, expensive circuits on the whole.

SUMMARY OF THE INVENTION

Accordingly, it is an object of the present invention to provide a new and improved circuit for generating a deviation signal indicating a deviation of a measured value from a digital command value of an angle with a simple, inexpensive circuit configuration.

The present invention accomplishes this object by the provision of a deviation signal generator circuit for providing an analog signal indicating a deviation of a measured angle $\theta a$ from a digital command angle $\theta d$, comprising, in combination, synchro means mounted on a rotary shaft to measure an angle of rotation $\theta a$ through which the rotary shaft is rotated, transformation means for receiving the measured angle of rotation $\theta a$ to produce analog signals representative of a cosine and a sine function thereof, a reversible binary counter set with a digital command angle of rotation $\theta d$, a phase shifting network including first analog switch means controlled in accordance with which of $2n$ equal intervals into which an angular range of from 0 to $2\pi$ radians is divided has the digital command angle of rotation located therein, where $n$ is an integer, to thereby selectively compose the cosine and sine function of the $\theta a$ to produce a cosine and a sine output of the $\theta a$ phase shifted by an angle of $2\pi k/n$ where $k$ is of any one of 0, 1, 2, . . . and $n$, a variable attenuator having applied thereto the cosine output from the phase shifting network and including second analog switch means controlled so as to effect a straight line approximation to a tangent function to produce the cosine output including an output linearly approximating the tangent function, and adder-subtracter means for receiving both the sine output from the phase shifting network and the cosine output with the output linearly approximating the tangent function from the variable attenuator to perform the addition or subtraction of both outputs in accordance with that interval having the digital command angle located therein to produce an output proportional to a deviation of the measured angle $\theta a$ from the digital command angle $\theta d$, wherein there are provided a first gating signal generator circuit having supplied thereto values of from the most significant bit to the bit for $\pi/n$ to generate gating signals for controlling the first analog switch means in the phase shifting network, and a second gating signal generator circuit responsive to the value of the bit for $\pi/n$ to select whether the true value of data expressed by values of from a bit for $\pi/2n$ to the least significant bit or a complement thereof is used and also responsive to the values of from the bit for $\pi/2\pi$ to the least significant bit to generate gating signals for controlling the second analog switch means in the variable attenuator.

BRIEF DESCRIPTION OF THE DRAWINGS

The present invention will become more readily apparent from the following detailed description taken in conjunction with the accompanying drawings in which:

FIG. 1 is a block diagram of a deviation signal generator circuit constructed in accordance with the principles of the prior art;

FIGS. 2 through 6 are graphs useful in mathematically explaining the principles of the present invention;

FIG. 7 is a schematic diagram of a deviation signal generator circuit constructed in accordance with the principles of the present invention;

DESCRIPTION OF THE PREFERRED EMBODIMENTS

Figures 1, 2, 3, 4A, 4B, 5:
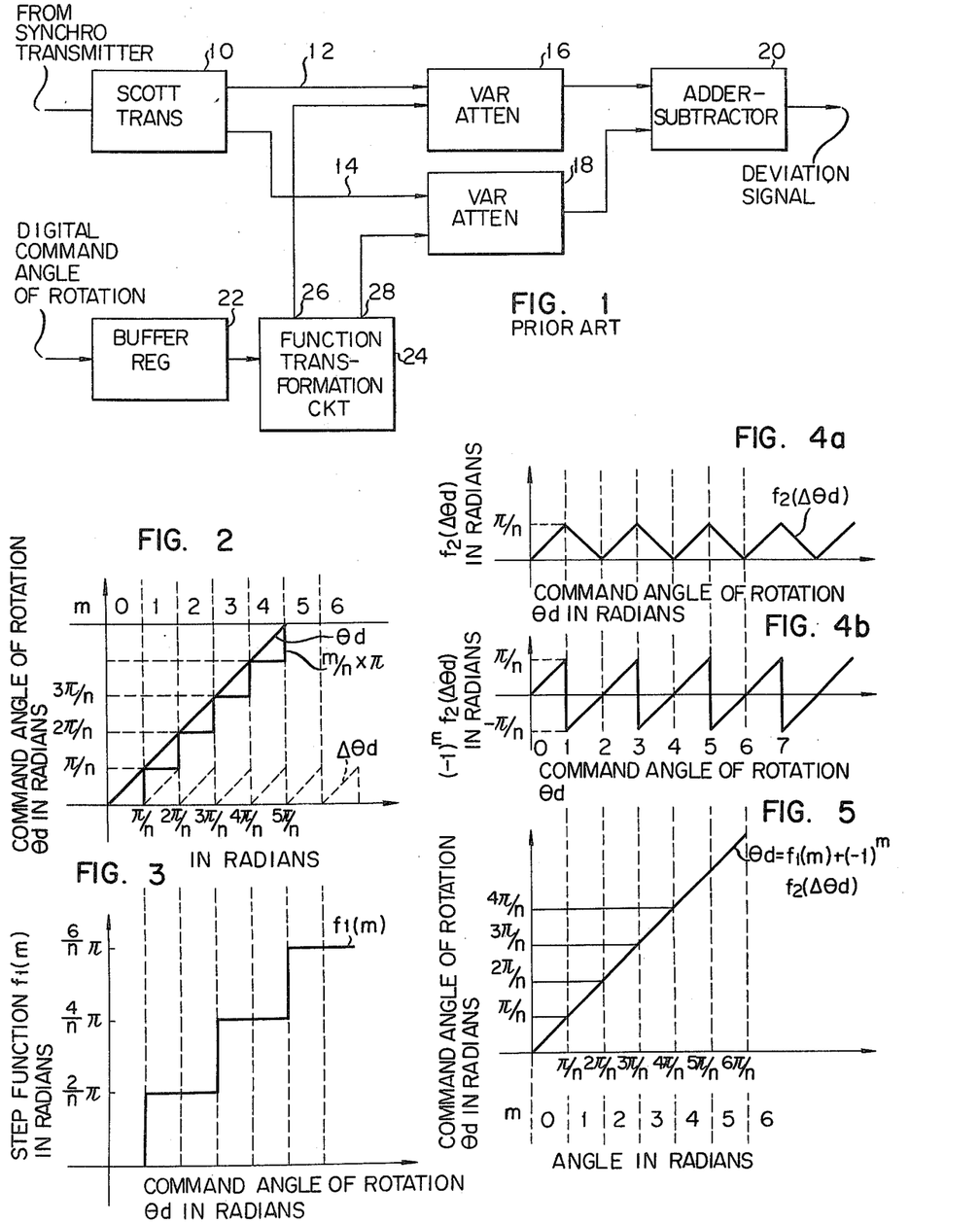

Referring now to the drawings and FIG. 1 in particular, there is illustrated a conventional deviation signal generator circuit for generating an analog signal indicating a deviation of the actual angle of rotation of a rotary body from a digital command angle of rotation externally set. The arrangement illustrated comprises a Scott transformer 10 having applied thereto an output from a synchro transmitter (not shown) and a pair of outputs connected through conductors 12 and 14 to respective variable attenuators 16 and 18, and an adder-subtractor 20 connected to the variable attenuators 16 and 18. The synchro transmitter is adapted to provide an electrical representation of the actual angle of rotation of a rotary body (not shown) to be measured.

The arrangement further comprises a buffer register 22 having applied thereto a digital command angle of rotation externally set for the rotary body, and a function transformation circuit 24 connected to the buffer register 22 and including a pair of outputs 26 and 28 connected to the variable attenuators 16 and 18 respectively.

In operation the Scott transformer 10 is responsive to the actual angle of rotation $\theta a$ supplied from the synchro transmitter (not shown) to produce a pair of analog outputs expressed by $k\cos\theta a \cdot \sin\omega t$ and $k\sin\theta a \cdot \sin\omega t$ on the conductors 12 and 14 respectively where $k$ is a ratio of transformation of the Scott transformer 10 and $\omega$ is an angular velocity of the output from the synchro transmitter. Only for purposes of illustration, $k\cos\theta a \cdot \sin\omega t$ and $k\sin\theta a \cdot \sin\omega t$ may be sometimes abbreviated hereinafter to "$k\cos\theta a$" and "$k\sin\theta a$" respectively.

On the other hand, a digital value $\theta d$ externally set for a command angle of rotation of the rotary body (not shown) is applied through the buffer register 22 to the function transformation circuit 24 which, in turn, supplies to the outputs 26 and 28 a sine and a cosine function of the set digital command angle $\theta d$ respectively.

The outputs, $\cos\theta a$ and $\sin\theta a$ from the Scott transformer 10 are supplied to the variable attenuators 16 and 18 respectively where they are attenuated in accordance with the cosine and sine functions from the function transformation circuit 24 respectively. Then the outputs from the variable attenuators 16 and 18 are supplied to the adder-subtracter 20 to be calculated in accordance with the following equation:

$$K(\cos\theta a \cdot \sin\theta d - \sin\theta a \cdot \cos\theta d)\sin\omega t = k\sin(\theta d - \theta a)\sin\omega t \quad (1)$$

Thus the adder-subtractor 20 can provide a deviation signal proportional to a sine value of a deviation between the command and actual angles of rotation $\theta d$ and $\theta a$ respectively.

In the conventional type of deviation signal generator circuits such as shown in FIG. 1, it has been required to use the function transformation circuit 24 enabled to provide a sine and a cosine output over the entire range in which a digital command angle of rotation is set while each of the sine and cosine outputs should have operatively associated therewith one variable attenuator. This has resulted in disadvantages that the resulting circuit configuration becomes complicated and expensive.

The present invention contemplates to eliminate the disadvantages of the prior art practice as above described.

The principles of the present invention will now be mathematically described in conjunction with FIGS. 2 through 6.

It is assumed that a synchro device mounted on a rotary shaft of a rotary body to be measured has an angle of rotation variable between 0 and $2\pi$ radians with the angular range of from 0 to $2\pi$ radians divided into $2n$ equal intervals where $n$ is an integer. It is also assumed that a digital value $\theta d$ set for an angle of rotation of the rotary body or the synchro device, that is, a digital command value therefor, is expressed by the equation $$\theta d = \frac{m}{n}\pi + \Delta\theta d \quad (2)$$

where $m$ has a value of any one of $0, 1, 2, \ldots$ and $2n-1$ and an increment $\Delta\theta d$ is equal to or greater than zero and less than $\pi/n$ radians. That is, $\theta d$ meets the relationship $0 \leq \Delta\theta d < \pi/n$. The equation (2) is shown by a straight line labelled "$\theta d$" in FIG. 2 as being, the sum of a step function $m/n\pi$ and the increment $\Delta\theta d$ shown at dotted line denoted adjacent the axis of abscissas as linearly increasing from 0 up to $\pi/n$ radian in each of the angular intervals 1, 2, 3, . . . and then abruptly falling to zero radian in the next interval.

Further a step function $f_1(m)$ of a variable $m$ that is null or an integer as above specified is defined by the equation $$f_1(m) = \frac{\pi}{n}\left(m + \frac{1-(-1)^m}{2}\right) \quad (3)$$

The step function $f_1(m)$ is shown in FIG. 3 and has a value as determined by which of the $2n$ equal intervals has the particular command angle of rotation located therein. For example, the step function $f_1(m)$ has a constant value of $2\pi/n$ in the intervals 1 and 2.

It is now assumed that in each interval of from $m \pi/n$ up to $(m + 1) \pi/n$ radians the incremental command angle $\Delta\theta d$ is defined by a function $f_2(\Delta\theta d)$ such that the function $f_2(\Delta\theta d)$ is equal to $\Delta\theta d$ for even $m$ and to a complement of the $\Delta\theta d$ in the form of a binary number for odd $m$. That is $$f_2(\Delta\theta d) = \Delta\theta d \quad \text{for even } m$$
$$= \overline{\Delta\theta d} \quad \text{for odd } m \quad (4)$$

The function $f_2(\Delta\theta d)$ is shown in FIG. 4a.

In order to eliminate the discontinuity of the function $f_2(\Delta\theta d)$ for the $\theta d$ equal to each of odd multiples of $\pi/n$, a function as shown in FIG. 4b can be introduced. This function is expressed by $$(-1)^m f_2(\Delta\theta d) \quad (5)$$

Namely, the function $(-1)^m f_2(\Delta\theta d)$ has a value variable between $-\pi/n$ and 0 radian for odd $m$ and between 0 and $+\pi/n$ radian for even $m$ and $m=0$.

By adding the equation (3) to the function (5), the equation (2) for $\theta d$ is transformed to the equation $$f_1(m) + (-1)^m f_2(\Delta\theta d) \quad (6)$$

Now the equation (6) can be used to calculate the sine signal, $\sin(\theta a - \theta d)$ of a deviation of the actual angle $\theta a$ from the digital command angle $\theta d$ as above described in conjunction with the equation (1), assuming that $\tan\theta d$ being a nonlinear function is subject to an approximation in an interval defined by $0 \leq \theta d < \pi/n$ radians. Thus the sine signal, $\sin(\theta a - \theta d)$ is calculated at $$\sin(\theta a - \theta d) = \sin\{\theta a - f_1(m) - (-1)^m f_2(\Delta\theta d)\}$$
$$= \cos\{f_2(\Delta\theta d)\}[\sin\{\theta a - f_1(m)\} - (-1)^m \cos\{\theta a - f_1(m)\}\tan\{f_2(\Delta\theta d)\}]$$

Assuming that a deviation signal for an angle of rotation is expressed by $$f(\theta a, \theta d) = \sin(\theta a - \theta d)/\cos\{f_2(\Delta\theta d)\},$$

the same can be expressed by the equation $$f(\theta a, \theta d) = \sin\{\theta a - f_1(m)\} - (-1)^m \cos\{\theta a - f_1(m)\}\tan\{f_2(\Delta\theta d)\} \quad (7)$$

It will be appreciated that the above assumption is sufficient to sense a deviation signal for the actual angle by servo system wherein the deviation signal is caused to decrease to zero. In the above equation (7), $\sin\{\theta a - f_1(m)\}$ and $\cos\{\theta a - f_1(m)\}$ represent signals having their phase angles shifted by $f_1(m)$ as compared with signals expressed by $\sin\theta a$ and $\cos\theta a$ respectively. By calculating $\theta d'$ in the digital manner following the equation $\theta d' = \theta d + \pi/n$ and replacing the step function $f_1(m)$ by another step function $g_1(\theta d')$ as shown in FIG. 6, the deviation signal $f(\theta a, \theta d)$ is expressed by the equation $$f(\theta a, \theta d) = \sin\{\theta a - g_1(\theta d')\} - (-1)^m \cos\{\theta a - g_1(\theta d')\}\tan\{f_2(\Delta\theta d)\} \qquad (8)$$

Figures 6, 7:
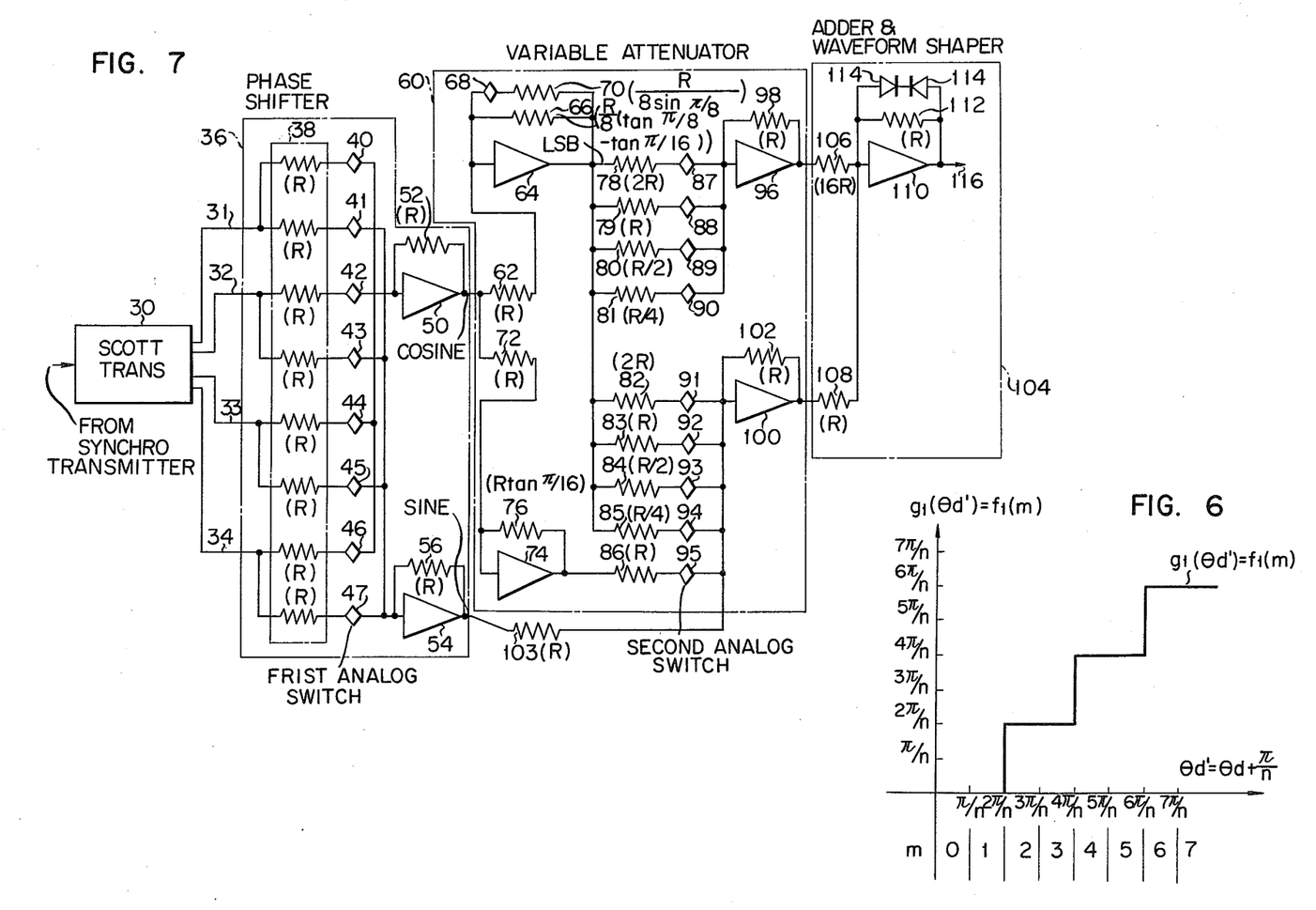

By comparing FIG. 6 with FIG. 3 it is seen that the function $g_1(\theta d')$ is different from the function $f_1(m)$ only in the variable.

The import of the equation (8) is summarized as follows: Analog signals representative of a sine and cosine of a measured angle $\theta a$, that is, $\sin\theta a$ and $\cos\theta a$ are composed into analog signals representative of a sine and cosine of the measured angle phase shifted by $$\frac{2\pi}{n}k$$

with respect to $\sin\theta a$ and $\cos\theta a$ respectively in accordance with which of $2n$ equal intervals into which an angular range of from 0 to $2\pi$ radians is divided has a command angle located therein, that is to say, with $k$ meeting the relationship $$\frac{2\pi}{n}(k+1) > \theta d + \frac{\pi}{n} \geq \frac{2\pi}{n}k$$

where $k$ has any value of 0, 1, 2, . . . and $n$. The phase shifted signals are expressed by $$\sin(\theta a - \frac{2\pi}{n}k)$$

and $$\cos(\theta a - \frac{2\pi}{n}k).$$

That analog signal representative of $$\cos(\theta a - \frac{2\pi}{n}k)$$

is controlled so as to impart to the same an attenuation as a linear function approximating a tangent function of that portion of the digital command angle expressed by values of from the most significant bit to a bit for $\pi/n$ or of a complement thereof. Then the analog signal thus attenuated is added to or subtracted from that analog signal representative of $$\sin(\theta a - \frac{2\pi}{n}k)$$

in accordance with that interval in which the digital command angle is located as described in the equation (8). This results in the formation of a deviation signal indicating a deviation of the measured angle $\theta a$ from the digital command angle $\theta d$.

The principles of the present invention as above described can be embodied into an arrangement such as shown in FIG. 7. The arrangement illustrated comprises a Scott transformer as schematically shown by block 30 having supplied thereto a single phase three wire output from a secondary side of a synchro transmitter mounted on a rotary shaft to be measured although the synchro transmitter and the rotary shaft are not illustrated. The Scott transformer 30 is responsive to the output from the synchro transmitter to produce analog signals representative of a cosine and a sine function of an angle through the shaft of the synchro transmitter has been rotated and includes two pair of outputs 31, 32, 33 and 34 connected to a phase shifting network generally designated by the reference numeral 36. The transformer 30 produces a positive-phase sequence component and a negative-phase sequence component of the cosine function at the outputs 31 and 32 and a positive-phase sequence component and a negative-phase sequence component of the sine function at the outputs 33 and 34.

The phase shifting network 36 is responsive to the sine and cosine outputs from the Scott transformer 30 to shift the phase angles of the sine and cosine functions of the actual angle of rotation applied thereto by suitably composing the sine and cosine signals from the transformer 30. The phase shifting network 36 includes a plurality, in this case, eight of fixed resistors collectively designated by the reference numeral 38 and serially connected to respective ON-OFF switching circuits 40 through 48 (which are called hereinafter "analog switches"). Each of the outputs from the transformer 30 is connected to an operational amplifier 50 with a feedback resistor 52 through one series combination of resistor and analog switch and to another operational amplifier 54 with a feedback resistor 56 through another series combination of resistor and analog switch. For example, the output 31 of the transformer 30 is connected to the operational amplifier 50 through the serially connected resistor and analog switch 35 and 40 respectively and to the operational amplifier 54 through the serially connected resistor and switch 35 and 41 respectively. Thus the resistors 35 serve as input resistors to the associated operational amplifiers.

The operational amplifiers 50 and 54 are connected to a variable attenuator generally designated by the reference numeral 60. More specifically, the output of the operational amplifier 50 is connected by an input resistor 62 to an operational amplifier 64 including a feedback resistor 66 and a series combination of an analog switch and resistor 68 and 70 respectively connected across the resistor 66. The components 62 through 70 cooperate with one another to generate a tangent function in accordance with a broken line approximation technique. Also for the purpose of the addition of the tangent function of a certain angle as will be described hereinafter, the output of the operational amplifier 50 is connected through an input resistor 72 to an operational amplifier 74 with a feedback resistor 76.

In order to closely interpolate an approximating value to the tangent function generated by the components 62 through 70, the output of the operational amplifier 64 is connected through a plurality, in this case four, of series combinations of resistors and analog switches 78, 79, 80, 81 and 87, 88, 89, 90 respectively to an operational amplifier 96 with a feedback resistor 98 and also through a plurality, in this case four, of series combinations of resistors and analog switches 82, 83, 84, 85 and 91, 92, 93, 94 respectively to a separate operational amplifier 100 with a feedback resistor 102. Further the output of the operational amplifier 74 is connected through a series combination of resistor and analog switch 86 and 95 respectively to the operational amplifier 100 having also connected thereto the output of the operational amplifier 54 through a resistor 103.

The outputs of the operational amplifiers 76 and 100 are connected to a combined adder and waveform shaper circuit generally designated by the reference numeral 104. The combined adder and waveform shaper circuit 104 includes a pair of input resistors 106 and 108 connected at one end to the outputs of the operational amplifiers 96 and 100 respectively and at the other ends to an operational amplifier 110 including a feedback resistor 112 and a pair of Zener diodes 114 connected back to back across the resistor 112. In the example illustrated, the lefthand diode 114 as viewed in FIG. 7 serves to limit the negatively going portion of the waveform while the righthand diode 114 serves to limit the positively going portion of the waveform.

In FIG. 7, the parenthesized reference character R with or without a factor denoted beside each resistor designates a value of resistance thereof. For example, the reference character R means that the associated resistor has a value of resistance of R and R/2 means that the associated resistor has a value of resistance of R/2.

Figure 8:
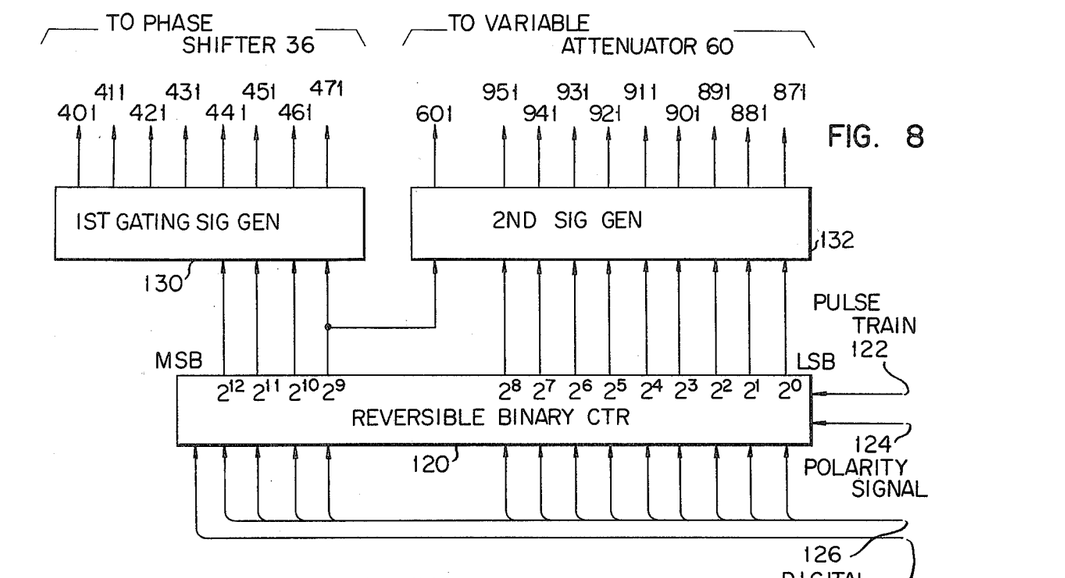
FIG. 8 is a logic block diagram of a control circuit for controlling the arrangement shown in FIG. 7.

FIG. 8 shows a control circuit for controlling the analog switches as illustrated in FIG. 7. The arrangement illustrated comprise a reversible binary counter 120 for counting plural bit pure binary numbers in this case, 13 bit binary numbers in the up and down directions. The counter 120 can be operative in response to the incremental instruction or the absolute value instruction. For the incremental instruction, the counter 120 is operative to count pulses of a pulse train 122 applied thereto in the up or down direction as determined by a polarity signal 124 applied thereto to store its count. For the absolute value instruction, the counter 120 is operative as a buffer register having both a digital command angle 126 in the form of a binary number and a setting signal 128 applied thereto. The command angle includes binary digits or values applied to corresponding bit positions on the counter as shown by $2^{12}, 2^{11}, \ldots, 2^1, 2^0$ in FIG. 8.

A count or content in the counter 120 is delivered to a pair of first and second gating signal generator circuits 130 and 132 which, in turn, generate gating signals. The gating signals from the first circuit 130 are supplied to the phase shifting network 36 to control the opening and closing of the analog switches 40 through 48 therein while those from the second circuit 132 are supplied to the variable attenuator 60 to control the opening and closing of the analog switches 68 and 87 through 95 therein.

More specifically, the count or content in the form of a pure binary number in the counter 120 in the example illustrated has values of the most significant bits (MSB) $2^{12}$ and three bits $2^{11}, 2^{10}$ and $2^9$ following it, applied to the first gating signal generator circuit 130, and values of the remaining nine bit $2^8, 2^7, \ldots 2^0$ lower than the first four bits, applied to the second gating signal generator circuit 132 along with the value of the least significant one of the first four bits. The first generator circuit 130 is responsive to the values of those four bits in the counter 120 to produce gating signals for controlling the ON and OFF operations of the analog switches 40 through 48 in the phase shifting network 36. Each of the gating signals is designated by the same reference numeral as the analog switch controlled thereby with the suffixed numeral "1". For example, the gating signal 401 is adapted to control the analog switch 40.

The value of the least significant one of the first four bits or, in this case, the value of the bit $2^9$ is used as a selection signal for determining whether true values of the lower nine bits or complements thereof are used for the purpose as will be apparent hereinafter. These digits indicate together the $\Delta\theta d$ appearing in the equation (2).

The second generator circuit 132 is responsive to values of the lower nine bits including the least significant bit (LSB) in the counter 120 to produce gating signals for controlling the analog switches 68 and 87 through 95 in the variable attenuator 60. Also each of the gating signals is designated by the same reference numeral as that analog switch controlled thereby with the suffixed numeral 1. For example, the gating signal 941 is adapted to control the ON and OFF operations of the analog switch 94.

In summary, the analog signals representative of the sine and cosine functions of the actual angle of rotation are passed through the phase shifting network 36 wherein the values of the four higher bits including the most significant bit for a digital command angle in the reversible counter 120 are operated on the analog signals to control phase angles thereof. Thus the phase shifting network 36 provides a pair of analog signals representing a sine and a cosine of the actual angle of rotation phase shifted by an angle of $2\pi k/n$ radians in accordance with that interval having the digital command angle located therein. Thus the phase shifting is accomplished with incremental angle of $\pi/n$ radian throughout the angular range of from 0 to $2\pi$ radians. That phase shifted analog signal representative of the cosine function is supplied to the variable attenuator through the output of the operational amplifier 50. On the other hand, the analog signal from the operational amplifier 54 thus phase-shifted and representative of the sine function is supplied to the combined adder and waveform shaper circuit 104 through the operational amplifier 100 with the output from the variable attenuator circuit 60. In the circuit 104, addition or subtraction is carried out between the two signals, as the case may be, thereby producing at the output terminal 116 an analog signal representing a deviation of the actual value $\theta a$ from the command value $\theta d$ of the angle of rotation.

The operation of the arrangements as shown in FIGS. 7 and 8 will now be described with reference to FIGS. 9 through 13. For puposes of illustration the first and second terms, $\sin\{\theta a - g_1(\theta d')\}$ and $\cos\{\theta a - g_1(\theta d')\}$ appearing on the righthand side of the equation (8) are called hereinafter a "sine output" and a "cosine output" and designated by "SINE" and "COSINE" in FIG. 7 respectively. It is assumed that the reversible binary counter 120 includes 13 bits of a pure binary number as above described associated with individual angles listed in the following Table I.

suitably composed to form the resultant cosine and sine functions phase shifted by incremental angles of $\pi/4$ Table I Relationship Between Bits And Angles Associated Therewith In Reversible Counter 120

| Bit | $2^{12}$ (MSB) | $2^{11}$ | $2^{10}$ | $2^9$ | $2^8$ | $2^7$ | $2^6$ | $2^5$ | $2^4$ | $2^3$ | $2^2$ | $2^1$ | $2^0$ (LSB) |
|---|---|---|---|---|---|---|---|---|---|---|---|---|---|
| Angle | $\pi$ | $\pi/2$ | $\pi/2^2$ | $\pi/2^3$ | $\pi/2^4$ | $\pi/2^5$ | $\pi/2^6$ | $\pi/2^7$ | $\pi/2^8$ | $\pi/2^9$ | $\pi/2^{10}$ | $\pi/2^{11}$ | $\pi/2^{12}$ |

As above described, the first gating generator circuit 130 is responsive to the values of the most significant bit ($2^{12}$) and three bit positions ($2^{11}$, $2^{10}$ and $2^9$) following it, that is to say, the values of from the most significant to the bit for $\pi/n$ to generate the gating signals 401, 411, 421, 431, 441, 451, 461 and 471. It will readily be understood that binary numbers having these four bits can identify respective intervals of command angles of rotation throughout the angular range of from 0 to $2\pi$ radians with increments of $\pi/8$.

Figure 13A:
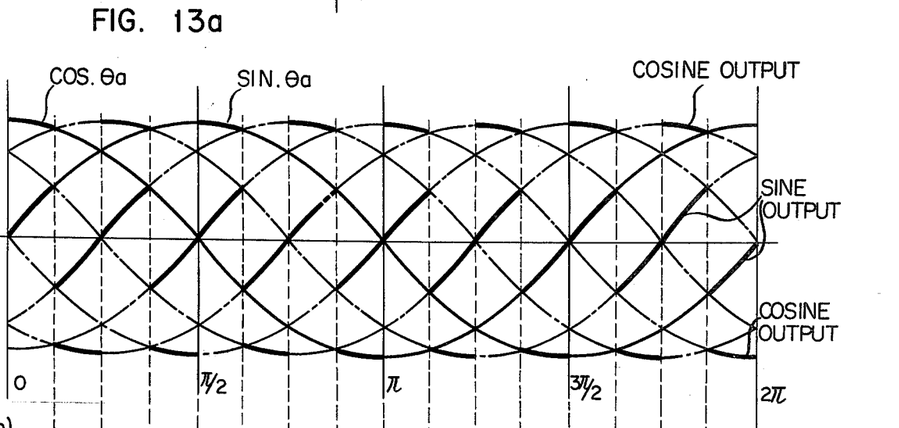
FIG. 13a is a graph illustrating phase-shifted sine and cosine functions due to different command angles.

The following Table II shows a truth table according to which the first gating signal generator circuit 130 generates gating signals in response to binary members including values of the abovementioned four bits $2^{12}$, $2^{11}$, $2^{10}$ and $2^9$, and also the intervals of command angles identified by the binary members.

radian with respect to the fundamental cosine and sine functions $\cos\theta a$ and $\sin\theta a$ respectively as shown in FIG. 13a wherein the fundamental sine and cosine functions are shown by solid line and the phase shifted functions are shown at thick line.

In this way a cosine output COSINE, $\cos\{\theta a - g_1(\theta d')\}$ and a sine output SINE, $\sin\{\theta a - g_1(\theta d')\}$ as seen in the equation (8) selected in any one of 16 intervals into which the angular range of from 0 to $2\pi$ radians is equally divided have been produced so as to be phase shifted by $\pi/4$ with respect to the fundamental sine and cosine functions $\sin\theta a$ and $\cos\theta a$ respectively as shown at thick line in FIG. 13a.

Then in order to determine the deviation signal $f(\theta a, \theta d)$, it is required to obtain a nonlinear function, $\tan\{f_2(\Delta\theta d)\}$ appearing in the equation (8). To this Table II Truth Table For First Gating Signal Generator 130 And Intervals Of Set Command Angles

| Values of higher Bits on Counter 120 | | | | | Gating Signals From First Generator 130 | | | | | | | |
|---|---|---|---|---|---|---|---|---|---|---|---|---|
| $2^{12}$ | $2^{11}$ | $2^{10}$ | $2^9$ | Interval of Set Command Angles | 401 | 441 | 421 | 461 | 451 | 431 | 471 | 411 |
| L | L | L | L | 0 up to $\pi/8$ | H | L | L | L | H | L | L | L |
| L | L | L | H | $\pi/8$ up to $2\pi/8$ | L | L | H | H | H | H | L | L |
| L | L | H | L | $2\pi/8$ up to $3\pi/8$ | H | H | L | L | H | H | L | L |
| L | L | H | H | $3\pi/8$ up to $4\pi/8$ | L | L | L | H | L | H | L | L |
| L | H | L | L | $4\pi/8$ up to $5\pi/8$ | L | H | L | L | L | H | L | L |
| L | H | L | H | $5\pi/8$ up to $6\pi/8$ | H | L | L | H | L | H | H | L |
| L | H | H | L | $6\pi/8$ up to $7\pi/8$ | L | H | H | L | L | H | H | L |
| L | H | H | H | $7\pi/8$ up to $8\pi/8$ | H | L | L | L | L | L | H | L |
| H | L | L | L | $8\pi/8$ up to $9\pi/8$ | L | L | H | L | L | L | H | L |
| H | L | L | H | $9\pi/8$ up to $10\pi/8$ | H | H | L | L | L | L | H | H |
| H | L | H | L | $10\pi/8$ up to $11\pi/8$ | L | L | H | H | L | L | H | H |
| H | L | H | H | $11\pi/8$ up to $12\pi/8$ | L | H | L | L | L | L | L | H |
| H | H | L | L | $12\pi/8$ up to $13\pi/8$ | L | L | L | H | L | L | L | H |
| H | H | L | H | $13\pi/8$ up to $14\pi/8$ | L | H | H | L | H | L | L | H |
| H | H | H | L | $14\pi/8$ up to $15\pi/8$ | H | L | L | H | H | L | L | H |
| H | H | H | H | $15\pi/8$ up to $16\pi/8$ | L | L | H | L | H | L | L | L |

Remark:
In columns for "values of Bits" characters "L" and "H" represent binary values, for example, binary ZERO and ONE respectively.
In columns for "Gating Signals From First Generator 130" the character "L" means that the signal turns the associated analog switch off and the character "H" means that it turns the associated analog switch on.

Figure 13B:
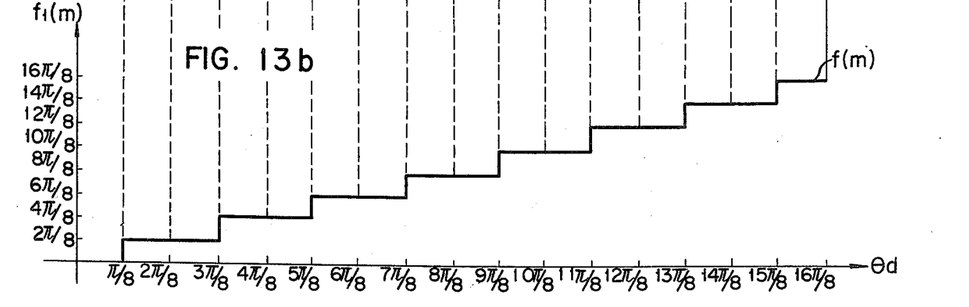
FIG. 13b is a graph similar to FIG. 6 for $n=8$.

The gating signals 401, 411, 421, 431, 441, 451, 461 and 471 are operative to turn the associated switches 40, 41, 42, 43, 44, 45, 46 and 47 on or off as listed in Table II to effect phase shifts throughout the angular range of from 0 to $2\pi$ radians with increments of $\pi/4$ radian as shown in FIG. 13b identical to FIG. 3 having the $n$ equal to eight (8). For example, with a command angle of rotation lying in an interval of from $5\pi/8$ up to $7\pi/8$ radians, the reversible counter 120 produces binary values L, H, L and H at the bits $2^{12}$, $2^{11}$, $2^{10}$ and $2^9$ respectively and the first gating generator circuit 130 generates gating signals for turning the analog switches 40, 43, 46 and 47 on and the analog switches 41, 42, 44 and 45 off as shown by the gating signal 401 being of H to turn the associated switch 40 on. This results in a phase shift of $6\pi/8$ radians.

In other words, positive- and negative-phase sequence components of the cosine function and those of the sine function of the actual angle of rotation can be end, the cosine output COSINE is applied to the variable attenuator 60 for a linear approximation.

In an interval defined by $0 \leq \Delta\theta d < \pi/8$, $\tan\{f_2(\Delta\theta d)\}$ can be generally approximated with a straight line expressed by $$\tan(\pi/8) \cdot \frac{\Delta\theta d}{\pi/8}$$

having a slope of $8/\pi \cdot \tan\pi/8$ which is called hereinafter a single line approximation. By considering the equation (8), $\tan\{f_2(\Delta\theta d)\}$ can approximate $$\tan(\pi/8) \frac{\Delta\theta d}{\pi/8}$$

for even $m$ and $$\tan(\pi/8) \cdot \frac{\Delta\theta d}{\pi/8}$$

Table III

Truth Table For Second Gating Signal Generator 132

| $2^9$ | $2^8$ | $2^7$ | $2^6$ | $2^5$ | $2^4$ | $2^3$ | $2^2$ | $2^1$ | $2^0$ | 601 | 951 | 941 | 931 | 921 | 911 | 901 | 891 | 881 | 871 |
|---|---|---|---|---|---|---|---|---|---|---|---|---|---|---|---|---|---|---|---|
| L | L | L | L | L | L | L | L | L | L | H | L | L | L | L | L | L | L | L | L |
| L | L | L | L | L | L | L | L | L | H | H | L | L | L | L | L | L | L | L | H |
| L | L | L | L | L | L | L | L | H | L | H | L | L | L | L | L | L | L | H | L |
| L | H | H | H | H | H | H | H | H | H | L | H | H | H | H | H | H | H | H | H |
| H | L | L | L | L | L | L | L | L | L | L | H | H | H | H | H | H | H | H | H |
| H | L | L | L | L | L | L | L | L | H | L | H | H | H | H | H | H | H | H | L |
| H | L | L | L | L | L | L | L | H | L | L | H | H | H | H | H | H | H | L | H |
| H | H | H | H | H | H | H | H | H | H | H | L | L | L | L | L | L | L | L | L |

Remark:
The characters "L" and "H" are identical in meaning to those listed in Table II.
$601 = \overline{951}$ for odd $m$ as will be understood from previous equations (4)

$$\tan\{f_2(\Delta\theta d)\} \doteq \tan(\pi/8) \cdot \frac{\Delta\theta d}{\pi/8} \text{ for even } m \quad (9)$$

and $$\tan\{f_2(\Delta\theta d)\} \doteq \tan(\pi/8) \cdot \frac{\Delta\theta d}{\pi/8} \text{ for odd } m \quad (10)$$

In this approximation, a maximum deviation of the approximate value $$\tan\pi/8 \cdot \frac{\Delta\theta d}{\pi/8}$$

from the true value of $\tan\Delta\theta d$ is of about $0.00144\pi$ radian or 0.26° in terms of the angle. On the other hand, with a command angle of rotation expressed by a 10 bit pure binary number, the least significant bit (LSB) has a value of $0.00195\pi$ radian or about 0.35° in terms of the angle. That figure is greater than the maximum deviation as above described. This means that, with a command angle of rotation expressed by a pure binary number having 10 bits or less, the single line approximation as above described is satisfactory.

If a command angle of rotation is high in resolution so that it is required to be expressed, for example, by a 13 bit pure binary number, then the least significant bit will have a value of about $0.00024\pi$ radian or 0.044° in terms of the angle. Under these circumstances, the use of the single line approximation causes a deviation of an approximate value from a true value to be too great as compared with the value of the least significant bit approximating $0.00024\pi$ radian. Thus the use of command angles of rotation having such a high resolution is meaningless. Therefore a closer approximation is required.

Figure 9:
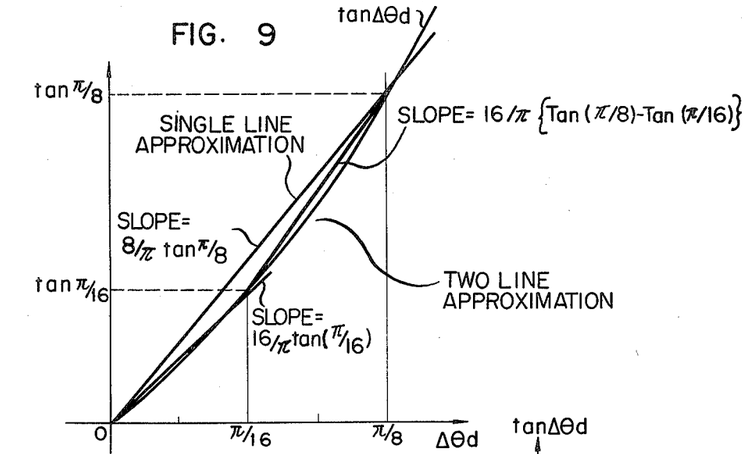
FIG. 9 is a graph illustrating a single straight line and a pair of intersecting straight lines approximating a tangent of an angle ranging from 0 to $\pi/8$ radian.

In this case, the interval of from 0 up to $\pi/8$ radian can be bisected to form a pair of sub-intervals of from 0 up to $\pi/16$ radian and from $\pi/16$ up to $\pi/8$ radian as shown in FIG. 9 and an approximation using a pair of intersecting straight lines one for each of the subintervals can be effected to decrease a deviation of an approximate value from a true value to $0.0001\pi$ radian or about 0.044° in terms of the angle. This may be called a two line approximation.

The two line approximation can be effected by the second gating signal generator circuit 132 whose operation follows a truth table listed in the following Table III.

It is seen from Table III that when the bits $2^9$ and $2^8$ in the reversible counter 120 are of an L value in the sub-interval as defined by $0 \leq \Delta\theta d < \pi/16$, the second gating generator circuit 132 outputs a gating signal 601 having an H value. That signal turns on the analog switch 68 connected across the operational amplifier 64 through the resistor 70. This causes the feedback resistor 70 to be connected across the amplifier 64. Thus the operational amplifier 64 includes a parallel combination of resistors 66 and 70 as a feedback resistor. A ratio of resistance between the parallel combination of resistors 66 and 70 and the input resistor 62 determines a slope of a straight line approximating $\tan\Delta\theta d$ in the sub-interval $(0-\pi/16)$. Thus that ratio of resistance is designed to be of $\frac{1}{2}\tan\pi/16$.

Also in the other sub-interval as defined by $\pi/16 \leq \Delta\theta d < \pi/8$, the bits $2^9$ and $2^8$ in the reversible counter 120 are of L and H value respectively so that the second gating generator circuit 132 generates a gating signal 601 at an L level as shown in the truth table listed in Table III. That gating signal 601 turns the associated analog switch 68 off. Therefore the operational amplifier 64 includes only the resistor 66 as its feedback resistor. A ratio of resistance between the resistor 66 and the input resistor 62 determines a slope of a straight line approximating $\tan\Delta\theta d$ in the sub-interval of from $\pi/16$ up to $\pi/8$. That ratio of resistance is selected to be of $\frac{1}{8}(\tan\pi/8 - \tan\pi/16)$.

Figure 10:
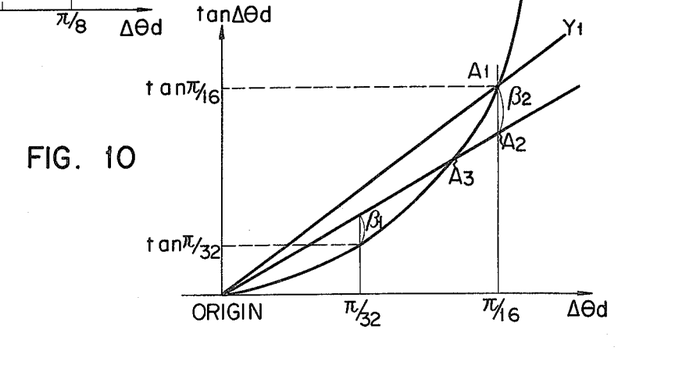
FIG. 10 is a graph illustrating the manner in which the optimum slope of a straight line is determined with a single line approximation shown in FIG. 9.

FIG. 10 shows the manner in which a slope of an approximating straight line is actually determined in order to further decrease an error in the resulting approximate value. As shown in FIG. 10, a straight line Y1 passing through the origin and a point A1($\pi/16$, $\tan\pi/16$) approximates $\tan\Delta\theta d$ in the sub-interval ($0 - \pi/16$). Assuming that $\beta_1$ and $\beta_2$ designate differences between values approximated by a straight line and the true values of $\Delta\theta d$'s equal to $\pi/32$ and $\pi/16$ radian respectively as shown in FIG. 10, a straight line passing through the origin is drawn so as to meet $\beta_1 + \beta_2 = 0$. That line is labelled Y2 in FIG. 10. The straight line Y2 can approximately halve the error as compared with the straight line Y1. This is true in the case of the sub-interval ($\pi/16 - \pi/8$).

In this way, the slopes for the two line approximation has been determined. The tangent function and strictly a linear function approximating the same or the output from the operational amplifier 64 is applied in parallel to a plurality of input resistors 78 through 85. At the same time, the second gating signal generator circuit 132 produces the gating signals 871, 881, 891, 901, 911, 921, 931, 941 and 951 in response to values at the lower ten bits $2^9$, $2^8$, ... $2^0$ on the reversible counter 120 as shown in Table III to control the associated analog switches 87, 88, 89, 90, 91, 92, 93, 94 and 95. This results in the interpolation of $\tan\Delta\theta d$ in the sub-interval as defined by $0 \leq \Delta\theta d < \pi/16$ with a resolution of $\pi/2^{12}$.

Similarly the interpolation can be calculated in the sub-interval as defined by $\pi/16 \leq \Delta\theta d < \pi/8$ by rendering a ratio of resistance between the feedback resistor 79 and the input resistor 72 for the operational amplifier 74 equal to $\tan\pi/16$ to multiply the cosine outputs COSINE from the operational amplifier 54 in the phase shifting network 36 by a factor of $\tan\pi/16$ and applying the multiplied output from the operational amplifier 74 to the operational amplifier 100. It will readily be understood that the latter interpolation is calculated with the same resolution of $\pi/2^{12}$ as that for the sub-interval of from 0 up to $\pi/16$ radian.

From the foregoing, the truth table shown in Table III and FIG. 9, it is seen that $\tan\{f_2(\Delta\theta d)\}$ can be expressed by either one of the following approximate equations:

For even $m$ $$\tan\{f_2(\Delta\theta d)\} \doteq \tan(\pi/16) \cdot \frac{\Delta\theta d}{\pi/16} \quad 0 \leq \Delta\theta d < \pi/16$$

$$\doteq \tan\pi/16 + [\tan\pi/8 - \tan\pi/16] \frac{\Delta\theta d - \pi/16}{\pi/16} \quad (11)$$

$$\pi/16 \leq \Delta\theta < \pi/8$$

For odd $m$ $$\tan\{f_2(\Delta\theta d)\} \doteq \tan\pi/16 + [\tan\pi/8 - \tan\pi/16]$$

$$\cdot \frac{\overline{\Delta\theta d} - \pi/16}{\pi/16} \quad 0 \leq \Delta\theta d < \pi/16 \quad (12)$$

$$\doteq \tan\pi/16 \cdot \frac{\overline{\Delta\theta d}}{\pi/16} \pi/16 \leq \Delta\theta d < \pi/8$$

As shown in FIG. 13a, the relationship between the sine and cosine outputs SINE and COSINE respectively selected in the interval $(0 - \pi/8)$ is the same as those selected in each of the remaining intervals extending through angles of $\pi/8$. This eliminates the necessity of providing a circuit for producing a tangent function throughout the range of from 0 to $2\pi$ radians. With the $\theta d$'s expressed by 10 bit binary numbers, the tangent function obtained only in the interval $(0 - \pi/8)$ can cover the entire range of from 0 to $2\pi$ radians which is one of the characteristic features of the present invention. In conventional systems wherein a command angle of rotation $\theta d$ is expressed at least by 10 bit binary number, it has been required to generate a tangent function in an angular interval of from 0 to $\pi/4$ radian resulting in the complicated approximation to the tangent function as compared with the present invention.

From the foregoing it will be appreciated that $\tan\{f_2(\Delta\theta d)\}$ appearing in the equation (9)

$$f(\theta a, \theta d) = \sin\{\theta a - g_1(\theta d)\} - (-1)^m \cos\{\theta a - g_1(\theta d)\}$$
$$\tan\{f_2(\Delta\theta d)\}$$

is expressed by the equations (11) for even $m$ and by the equations (12) for odd $m$. In this way the deviation signal $f(\theta a, \theta d)$ has been produced.

Figure 11:
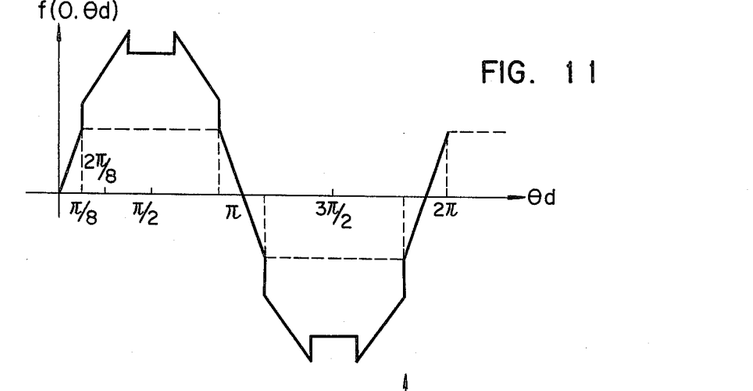
FIG. 11 is a graph illustrating a waveform of a deviation signal generated by the arrangements shown in FIGS. 7 and 8 prior to shaping the waveform thereof.
Figure 12:
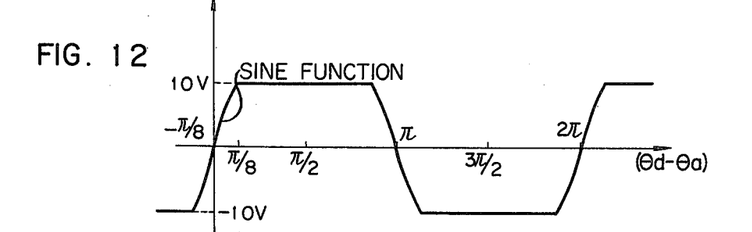
FIG. 12 is a graph illustrating the waveform of the deviation signal of FIG. 11 after the shaping thereof.

Assuming that $\theta d$ varies between 0 and $2\pi$ radians while $\theta a$ remains null ($\theta a = 0$), the resulting deviation signal $f(0, \theta d)$ is shown in FIG. 11. From FIG. 11 it will be appreciated that the deviation function $f(\theta a, \theta d)$ is generally continuous in intervals defined by $$l\pi - \frac{\pi}{8} < \theta d - \theta a < l\pi + \frac{\pi}{8}$$

where $l$ is of any one of 0, 1, 2, ... and may be discontinuous in the remaining intervals. By shearing or limiting the deviation function of FIG. 11 along dotted lines parallel to the axis of absicissos on both sides thereof as shown in FIG. 11, the function is transformed as illustrated in FIG. 12. The shearing of the deviation signal can be accomplished by the Zener diodes 114 as above described in conjunction with FIG. 7. That portion of the transformed function lying in an interval extending from each of zero passing points thereof on both sides to $-\pi/8$ and $+\pi/8$ is in the form of a sine function as will readily be understood from the equation (7). The deviation signal $f_1(\theta a, \theta d)$ is not required to be in the form of a perfect sine function throughout the range of from 0 to $2\pi$ radians for the following reason: As will readily be understood from applications of the present invention that will be described hereinafter, the synchro/digital conversion and the digital/synchro positioning for example is accomplished by follow-up systems operative to render the deviation signal null. Therefore it is required only to cause the zero passing points of the deviation signal to be accurate and to provide good rectilinearity in the vicinity of each of the zero passing points.

As an example, the arrangement of FIG. 7 could have the following circuit parameters with the R having a magnitude of 200 k$\Omega$.

| | |
|---|---|
| Fixed Resistors 38 | R = 200 k$\Omega$ |
| All analog Switches | Including the Field Effect Transistor |
| Fixed Resistor 70 | R $\frac{1}{8\sin\pi/8}$ = 65,3275 k$\Omega$ |
| Fixed Resistor 60 | R($\tan\pi/8 - \tan\pi/16$) $\frac{1}{8}$ = 5.3825 k$\Omega$ |
| Fixed Resistor 76 | 200 $\tan\pi/16$ = 49.725 k$\Omega$ |
| Fixed Resistors 78 and 82 | 400 k$\Omega$ |
| Fixed Resistors 80 and 84 | 100 k$\Omega$ |
| Fixed Resistors 81 and 85 | 50 k$\Omega$ |
| Fixed Resistor 106 | 3.2 M$\Omega$ |
| Other Resistors | 200 k$\Omega$ |
| Zener Diodes 114 | Rated Voltage of 10V |

While the present invention has been described in terms of 13 bit pure binary numbers representing command angles of rotation, it is to be understood that it is equally applicable to pure binary numbers having any desired number of bits other than 13 bits.

Figure 14:
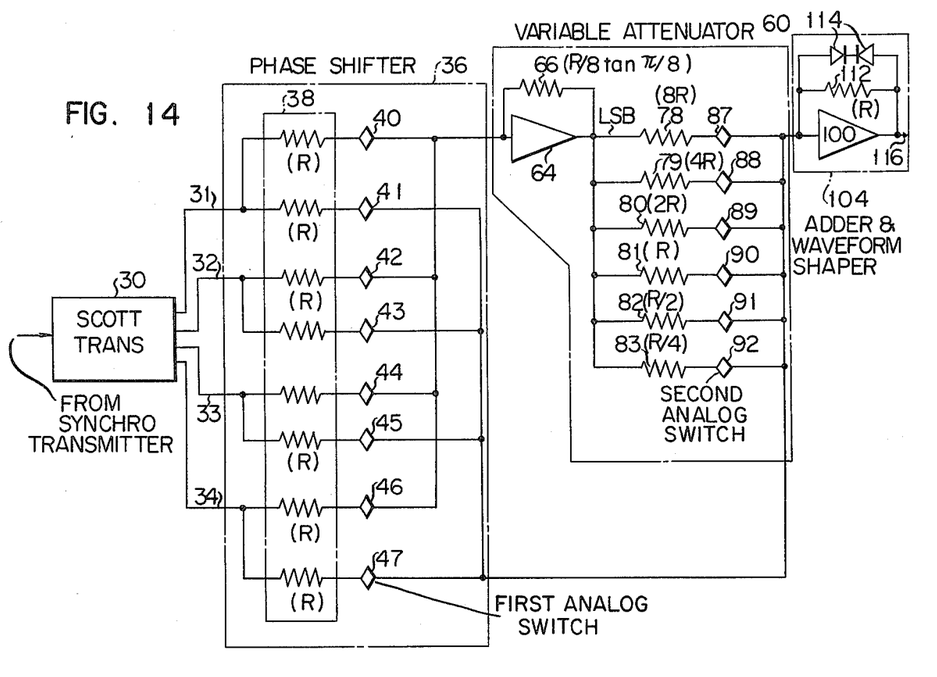
FIG. 14 is a circuit diagram of a modification of the present invention.
Figure 15:
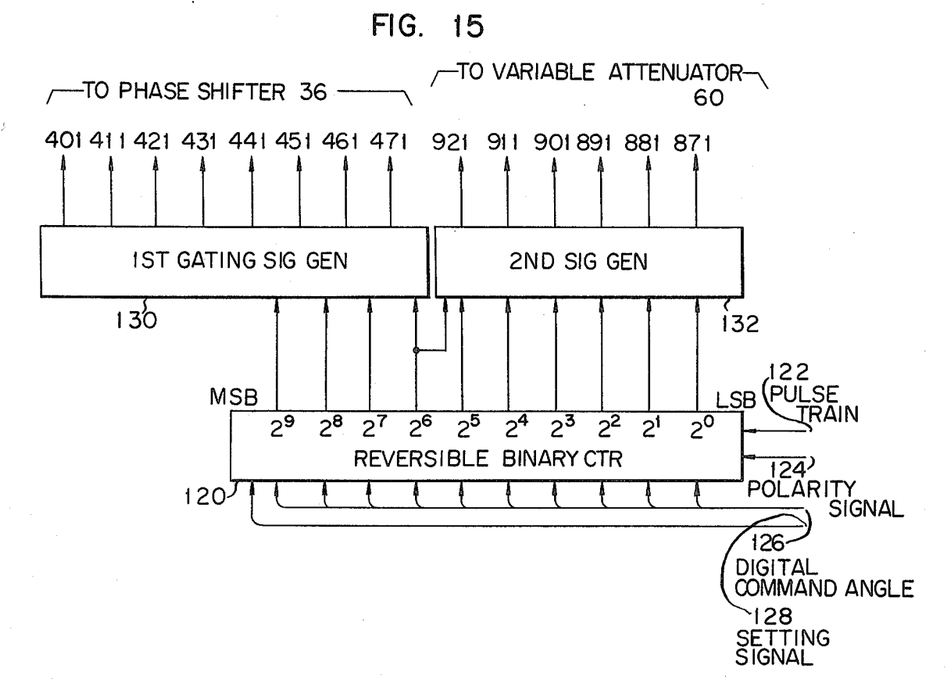
FIG. 15 is a logic block diagram of a control circuit for controlling the arrangement shown in FIG. 14.

FIGS. 14 and 15 show arrangements using 10 bit pure binary numbers and much simplified as compared with the arrangements as shown in FIGS. 7 and 8. In FIGS. 14 and 15 like reference numerals designate the components identical or similar to those shown in FIGS. 7 and 8. In FIG. 14 the operational amplifiers 50 and 54 and their feedback resistors 52 and 56 are omitted from the phase shifting network 36 and the variable attenuator 60 is formed only of six resistors 78 through 83 and analog switches 87 through 92 serially connected to the resistors respectively. In order to generate a cosine function by the phase shifting network 36, a ratio of resistance between the input resistor 38 to the operational amplifier 64 and the feedback resistor 66 therefor has a value of ⅛tanπ/8.

As above described, the tangent function can be satisfactorily approximated with a single straight line in an interval of from 0 up to π/8 radian for a command angle of rotation in the form of a pure binary number having 10 bits or less. Therefore in the variable attenuator 60 as shown in FIG. 14 the single line approximation is effected in the interval (0 −π/8) as previously described in conjunction with FIG. 9.

All the analog switches as shown in FIG. 14 are controlled by the arrangement of FIG. 15 identical to that illustrated in FIG. 8 except for the number of the bits on the reversible counter 120 and the number of the gating signals produced by the second generator circuit 132.

The first gating signal generator circuit 130 follows a truth table shown in the following Table IV also indicating intervals of command angles of rotation set by values at the most significant bit position $2^9$ and three bit positions $2^8$, $2^7$ and $2^6$ following it.

Table IV

Truth Table for First Gating Signal Generator 130 and Intervals of Command Angles

| Values of Higher Bits on Counter 120 | | | | | Gating Signals From First Generator 130 | | | | | | | |
|---|---|---|---|---|---|---|---|---|---|---|---|---|
| $2^9$ | $2^8$ | $2^7$ | $2^6$ | Interval of Set Command Angles | 401 | 441 | 421 | 461 | 541 | 431 | 471 | 411 |
| L | L | L | L | 0 up to π/8 | H | L | L | L | H | L | L | L |
| L | L | L | H | π/8 up to 2π/8 | L | L | H | H | H | H | L | L |
| L | L | H | L | 2π/8 up to 3π/8 | H | H | L | L | H | H | L | L |
| L | L | H | H | 3π/8 up to 4π/8 | L | L | L | H | L | H | L | L |
| L | H | L | L | 4π/8 up to 5π/8 | L | H | L | L | L | H | L | L |
| L | H | L | H | 5π/8 up to 6π/8 | H | L | L | H | L | H | H | L |
| L | H | H | L | 6π/8 up to 7π/8 | L | H | H | L | L | H | H | L |
| L | H | H | H | 7π/8 up to 8π/8 | H | L | L | L | L | L | H | L |
| H | L | L | L | 8π/8 up to 9π/8 | L | L | H | L | L | L | H | L |
| H | L | L | H | 9π/8 up to 10π/8 | H | H | L | L | L | L | H | H |
| H | L | H | L | 10π/8 up to 11π/8 | L | L | H | H | L | L | H | H |
| H | L | H | H | 11π/8 up to 12π/8 | L | H | L | L | L | L | L | H |
| H | H | L | L | 12π/8 up to 13π/8 | L | L | L | H | L | L | L | H |
| H | H | L | H | 13π/8 up to 14π/8 | L | H | H | L | H | L | L | H |
| H | H | H | L | 14π/8 up to 15π/8 | H | L | L | H | H | L | L | H |
| H | H | H | H | 15π/8 up to 16π/8 | L | L | H | L | H | L | L | L |

Remark:
The characters "H" and "L" have the same meaning as those in Table II.

Also the second gating signals generator circuit 132 follows a truth table listed in the following Table V.

Table V

Truth Table For Second Gating Signal Generator 132

| Values Of Lower Bits On Counter 120 | | | | | | | Gating Signals From Second Generator 132 | | | | | |
|---|---|---|---|---|---|---|---|---|---|---|---|---|
| $2^6$ | $2^5$ | $2^4$ | $2^3$ | $2^2$ | $2^1$ | $2^0$ | 921 | 911 | 901 | 891 | 881 | 871 |
| L | L | L | L | L | L | L | L | L | L | L | L | L |
| L | L | L | L | L | L | H | L | L | L | L | L | H |
| L | L | L | L | L | H | L | L | L | L | L | H | L |
| L | H | H | H | H | H | L | H | H | H | H | H | L |
| L | H | H | H | H | H | H | H | H | H | H | H | H |
| H | L | L | L | L | L | L | H | H | H | H | H | H |
| H | L | L | L | L | L | H | H | H | H | H | H | L |
| H | L | L | L | L | H | L | H | H | H | H | L | H |
| H | H | H | H | H | H | L | L | L | L | L | L | H |
| H | H | H | H | H | H | H | L | L | L | L | L | L |

In other respects the arrangements as shown in FIGS. 14 and 15 substantially identical in operation to those illustrated in FIGS. 7 and 8. In FIG. 14, relative magnitudes of resistance are also denoted beside the associated resistors as in FIG. 7.

While the present invention has a variety of applications, the same is particularly effective for synchro/digital conversion and digital/synchro positioning.

Figure 16:
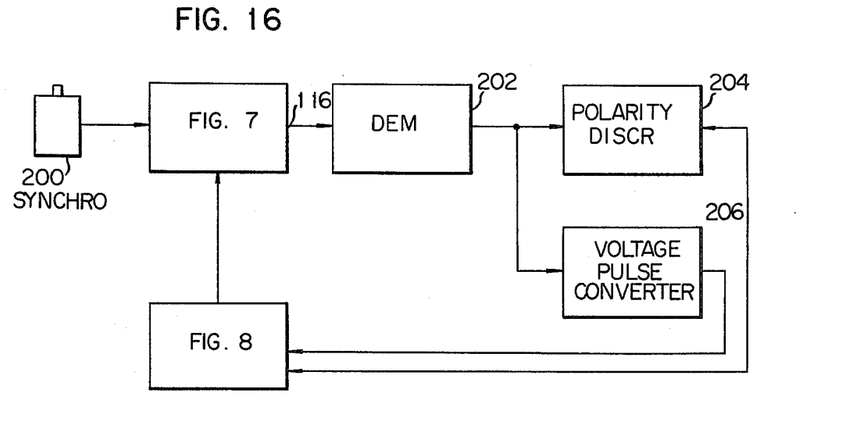
FIG. 16 is a block diagram of a synchro digital converter to which the present invention is applied.

FIG. 16 is a block diagram of a synchro/digital conversion system into which the present invention is incorporated. The arrangement of FIG. 7 controlled by that shown in FIG. 8 has applied thereto the actual angle of rotation of a synchro's shaft 200 and produces a deviation signal at the output 116. The deviation signal is applied to a demodulator circuit 202 where it is demodulated to produce a DC signal. The DC signal from the demodulator circuit 202 is supplied to a polarity discriminator circuit 204 for producing a polarity signal indicating the polarity of the DC signal and also to a voltage/pulse converter circuit 206 where it is converted to a train of pulses in accordance with the deviation signal.

The polarity signal from the polarity discriminator circuit 204 is supplied to the arrangement of FIG. 8 along with the train of pulses from the converter circuit 206 to drive the reversible counter 120 (see FIG. 8). As a result, the analog switches disposed in the phase shifting network and variable attenuator 36 and 60 respectively as shown in FIG. 7 are controlled in accordance with the content in the reversible counter 120 and following the truth tables listed in Tables II and III respectively. Thus the system performs the so-called closed loop control.

Figure 18:
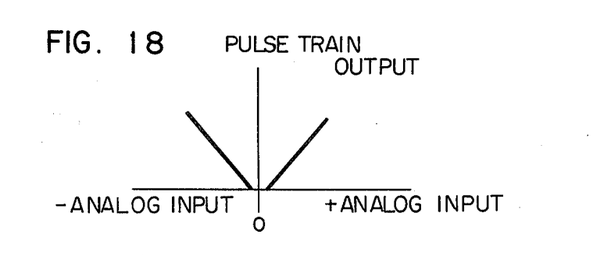
FIG. 18 is a graph illustrating the characteristic of the voltage pulse converter shown in FIG. 16.

The voltage/pulse converter circuit 206 has the characteristic such as shown in FIG. 18. More specifically, the converter circuit 206 is responsive to the polarity and magnitude of the deviation signal to produce pulses. On the other hand, the reversible counter 120 is operative to count the pulses from the converter circuit 206 in a direction to decrease the deviation signal until the deviation signal becomes null. At that time, the system is stabilized and the actual angle of rotation $\theta a$ of the synchro shaft 200 equals an angle of rotation $\theta d$ registered on the reversible counter 120 whereby the content in the counter 120 indicates the angle of rotation of the synchro shaft 200.

Figure 17:
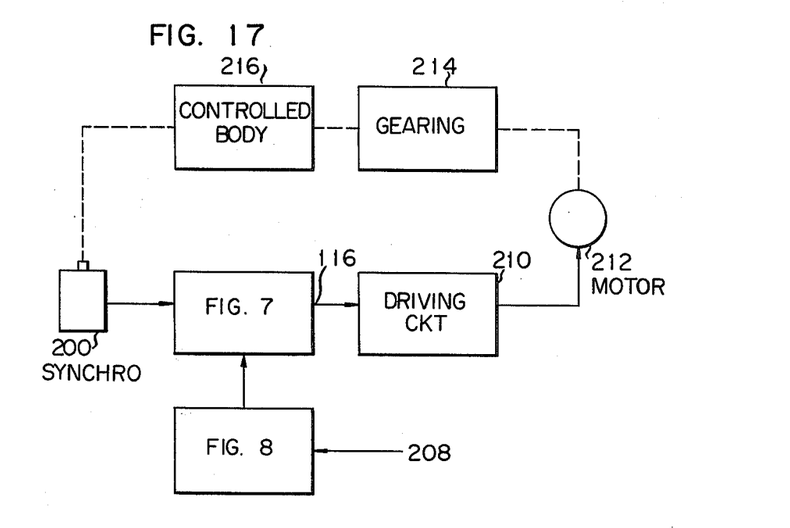
FIG. 17 is a block diagram of a digital synchro positioning system to which the present invention is also applied.

FIG. 17 is a block diagram of a digital/synchro positioning system into which the present invention is also incorporated. As in the arrangement of FIG. 16, the arrangement of FIG. 7 controlled by that shown in FIG. 8 is applied with the actual angle of rotation of the synchro's shaft 200. The arrangement of FIG. 7 produces a deviation signal at the output 116 by having a command angle of rotation and a setting signal applied to the inputs 126 and 128 illustrated in FIG. 8, as shown by the reference numeral 208 in FIG. 18 for the absolute value control, and a polarity signal and a pulse train applied to the inputs 122 and 124 shown in FIG. 8 for the incremental control.

The deviation signal from the arrangement of FIG. 7 is applied to a driving circuit 210 to drive on electric motor 212. The motor 212 controls a body 216 to be controlled through a gearing 214 while at the same time rotating a synchro device 200 secured to the body 216 to be controlled to sense the actual angle of rotation thereof. Thus the system controls the positioning of the body 216 so that the command value is equal to the actual value of the angle of rotation.

From the foregoing it will be appreciated that the present invention provides an analog deviation signal from analog signals representative of a sine and a cosine function of a measured angle $\theta a$ which deviation signal depends upon a deviation of the measured angle $\theta a$ from a digital command angle $\theta d$. By utilizing this, a signal from a synchro device or a synchro resolver may be converted to a digital signal and the digital synchro positioning may be effected and so on.

In FIGS. 16 and 17, it will readily be appreciated that the arrangements as shown in FIG. 14 and 15 may be substituted for those illustrated in FIGS. 7 and 8 with an angle of rotation having a low resolution, for example, that expressed by a binary number having 10 bits or less.

While the present invention has been illustrated and described in conjunction with a few preferred embodiments thereof it is to be understood that various changes and modifications may be resorted to without departing from the spirit and scope of the invention.

For example, more than two intersecting straight lines may be used to linearly approximate the tangent function. Instead of an AC deviation signal as above described, a DC deviation signal may be produced by supplying the AC deviation signal to a demodulator circuit as in the arrangement of FIG. 16. Also a synchro resolver may be substituted for a synchro device. In the latter case, the Scott transformer may be replaced by either a conventional simple transformer or any suitable combination of semi-conductor elements.

What we claim is:

1. A deviation signal generator circuit for providing an analog signal indicating a deviation of a measured angle of rotation from a digital command angle of rotation, comprising, in combination, synchro means mounted on a rotary shaft for measuring an angle of rotation $\theta a$ through which the rotary shaft is rotated, transformation means for receiving said measured angle of rotation $\theta a$ to produce analog signals representative of a cosine and a sine function thereof, a reversible binary counter set by an external command signal representative of a digital command angle of rotation $\theta d$, a phase shifting network including first analog switch means controlled for phase shifting said analog signals representative of a sine and a cosine of the measured angle of rotation $\theta a$ by angular increments of $\pi/4$, a variable attenuator having applied thereto said phase-shifted cosine output signal from said phase shifting network and including second analog switch means controlled so as to effect attenuation characteristics equal to a linear approximation to a tangent function of $\pi/8$ only in an angular range from 0 to $\pi/8$ to develop an output signal equal to the product of said approximation of the tangent function of $\pi/8$ and said phase-shifted cosine output signal, adder-subtracter means for receiving both said phase-shifted sine output signal from said phase shifting network and said product output signal from said variable attenuator to perform either the addition or subtraction of both said phase-shifted sine output signal and said product output signal in accordance with that interval having said digital command angle of rotation $\theta d$ located therein to produce an output signal approximation to a sine function of a deviation angle $(\theta d - \theta a)$ of the measured angle $\theta a$ from the digital command angle $\theta d$ with said deviation angle $(\theta d - \theta a)$ limited at most to an angular interval of $p\pi \pm \pi/8$ where $p$ is zero or an integer, a first gating signal generator circuit receptive of the most significant bit to a bit for $\pi/2^3$ of the setting of said binary counter to generate signals for controlling said first analog switch means in said phase shifting network, and a second gating signal generator circuit responsive to the value of the bit for $\pi/2^3$ to select whether the value of the bits of the setting of said binary counter from a bit for $\pi/8$ to the least significant bit or a complement thereof is used and responsive to the values of from the bit for $\pi/8$ to the least significant bit to generate signals for controlling said second analog switch means in said variable attenuator.

2. A deviation signal generator circuit for providing an analog signal indicating a deviation of a measured angle of rotation from a digital command angle of rotation, comprising, in combination, synchro means mounted on a rotary shaft for measuring an angle of rotation $\theta a$ through which the rotary shaft is rotated, transformation means for receiving said measured angle of rotation $\theta a$ to produce analog signals representative of a cosine and a sine function thereof, a reversible 13 bit binary counter set by an external command signal representative of a digital command angle of rotation θd, a phase shifting network including first analog switch means controlled for phase shifting said analog signals representative of a sine and a cosine of the measured angle of rotation θa by an angle of $2\pi k/8$ where $k$ is an integer less than or equal to the integer eight in accordance with which of 16 equal intervals into which an angular range of from 0 to $2\pi$ radians is divided, said digital command angle of rotation θd lies, a variable attenuator having applied thereto said phase-shifted cosine output signal from said phase shifting network and including second analog switch means controlled so as to effect attenuation characteristics equal to a linear approximation to a tangent function of $\pi/8$ using a single straight line only in an angular range from 0 to $\pi/8$ to develop an output signal equal to the product of said approximation of the tangent function of $\pi/8$ and said phase-shifted cosine output signal, adder-subtracter means for receiving both said phase-shifted sine output signal from said phase shifting network and said product output signal from said variable attenuator to perform either the addition or subtraction of both said phase-shifted sine output signal and said product output signal in accordance with that interval having said digital command angle of rotation θd located therein to produce an output signal approximation to a sine function of a deviation angle $(\theta d - \theta a)$ of the measured angle θa from the digital command angle θd with said deviation angle $(\theta d - \theta a)$ limited at most to an angular interval of $p\pi \pm \pi/8$ where $p$ is zero or an integer, a first gating signal generator circuit receptive of the most significant bit to a bit for $\pi/8$ of the setting of said binary counter to generate signals for controlling said first analog switch means in said phase shifting network, and a second gating signal generator circuit responsive to the value of the bit for $\pi/8$ to select whether the value of the bits of the setting of said binary counter from a bit for $\pi/16$ to the least significant bit or a complement thereof is used and responsive to the values of from the bit for $\pi/16$ to the least significant bit to generate signals for controlling said second analog switch means in said variable attenuator.

3. A deviation signal generator circuit for providing an analog signal indicating a deviation of a measured angle of rotation from a digital command angle of rotation, comprising, in combination, synchro means mounted on a rotary shaft for measuring an angle of rotation θa through which the rotary shaft is rotated, transformation means for receiving said measured angle of rotation θa to produce analog signals representative of a cosine and a sine function thereof, a reversible 13 bit binary counter set by an external command signal representative of a digital command angle of rotation θd, a phase shifting network including first analog switch means controlled for phase shifting said analog signals representative of a sine and a cosine of the measured angle of rotation θa by an angle of $2\pi k/8$ where $k$ is an integer less than or equal to the integer eight in accordance with which of 16 equal intervals into which an angular range of from 0 to $2\pi$ radians is divided, said digital command angle of rotation θd lies, a variable attenuator having applied thereto said phase-shifted cosine output signal from said phase shifting network and including second analog switch means controlled so as to effect attenuation characteristics equal to a linear approximation to a tangent function of $\pi/8$ by using at least two intersecting straight lines only in an angular range from 0 to $\pi/8$ to develop an output signal equal to the product of said approximation of the tangent function of $\pi/8$ and said phase-shifted cosine output signal, adder-subtracter means for receiving both said phase-shifted sine output signal from said phase shifting network and said product output signal from said variable attenuator to perform either the addition or subtraction of both said phase-shifted sine output signal and said product output signal in accordance with that interval having said digital command angle of rotation θd located therein to produce an output signal approximation to a sine function of a deviation angle $(\theta d - \theta a)$ of the measured angle θa from the digital command angle θd with said deviation angle $(\theta d - \theta a)$ limited at most to an angular interval of $p\pi \pm \pi/8$ where $p$ is zero or an integer, a first gating signal generator circuit receptive of the most significant bit to a bit for $\pi/8$ of the setting of said binary counter to generate signals for controlling said first analog switch means in said phase shifting network, and a second gating signal generator circuit responsive to the value of the bit for $\pi/8$ to select whether the value of the bits of the setting of said binary counter from a bit for $\pi/16$ to the least significant bit or a complement thereof is used and responsive to the values of from the bit for $\pi/16$ to the least significant bit to generate signals for controlling said second analog switch means in said variable attenuator.

4. A deviation signal generator circuit for providing an analog signal indicating a deviation of a measured angle of rotation from a digital command angle of rotation, comprising, in combination, synchro means mounted on a rotary shaft for measuring an angle of rotation θa through which the rotary shaft is rotated, transformation means for receiving said measured angle of rotation θa to produce analog signals representative of a cosine and a sine function thereof, a reversible 10 bit binary counter set by an external command signal representative of a digital command angle of rotation θd, a phase shifting network including first analog switch means controlled for phase shifting said analog signals representative of a sine and a cosine of the measured angle of rotation θa by an angle of $2\pi k/8$ where $k$ is an integer less than or equal to the integer eight in accordance with which of 16 equal intervals into which an angular range of from 0 to $2\pi$ radians is divided, said digital command angle of rotation θd lies, a variable attenuator having applied thereto said phase-shifted cosine output signal from said phase shifting network and including second analog switch means controlled so as to effect attenuation characteristics equal to a linear approximation to a tangent function of $\pi/8$ by using a single straight line only in an angular range from 0 to $\pi/8$ to develop an output signal equal to the product of said approximation of the tangent function of $\pi/8$ and said phase-shifted cosine output signal, adder-subtracter means for receiving both said phase-shifted sine output signal from said phase shifting network and said product output signal from said variable attenuator to perform either the addition or substraction of both said phase-shifted sine output signal and said product output signal in accordance with that interval having said digital command angle of rotation θd located therein to produce an output signal approximation to a sine function of a deviation angle $(\theta d - \theta a)$ of the measured angle θa from the digital command angle θd with said deviation angle $(\theta d - \theta a)$ limited at most to an angular interval of $p\pi \pm \pi/8$ where $p$ is zero or an integer, a first gating signal generator circuit receptive of the most significant bit to a bit for $\pi/8$ of the setting of said binary counter to generate signals for controlling said first analog switch means in said phase shifting network, and a second gating signal generator circuit responsive to the value of the bit for $\pi/8$ to select whether the value of the bits of the setting of said binary counter from a bit for $\pi/16$ to the least significant bit or a complement thereof is used and responsive to the values of from the bit for $\pi/16$ to the least significant bit to generate signals for controlling said second analog switch means in said variable attenuator.

* * * * *